United States Patent
He et al.

(10) Patent No.: US 10,578,963 B2
(45) Date of Patent: Mar. 3, 2020

(54) MASK PATTERN GENERATION BASED ON FAST MARCHING METHOD

(71) Applicant: ASML US, LLC, Chandler, AZ (US)

(72) Inventors: Yuan He, San Jose, CA (US); Jie Lin, San Jose, CA (US); Jihui Huang, San Jose, CA (US)

(73) Assignee: ASML US, LLC, Chandler, AZ (US)

( * ) Notice: Subject to any disclaimer, the term of this patent is extended or adjusted under 35 U.S.C. 154(b) by 15 days.

(21) Appl. No.: 15/959,968

(22) Filed: Apr. 23, 2018

(65) Prior Publication Data
US 2019/0324366 A1    Oct. 24, 2019

(51) Int. Cl.
*G06F 17/50* (2006.01)
*G03F 1/70* (2012.01)
*G03F 1/76* (2012.01)

(52) U.S. Cl.
CPC . *G03F 1/70* (2013.01); *G03F 1/76* (2013.01)

(58) Field of Classification Search
CPC ..................................... G03F 1/70; G03F 1/76
USPC .......................................................... 716/52
See application file for complete search history.

(56) References Cited

U.S. PATENT DOCUMENTS

| | | | | |
|---|---|---|---|---|
| 7,487,489 B2* | 2/2009 | Granik | ...................... | G03F 1/36 716/51 |
| 7,987,434 B2* | 7/2011 | Granik | ...................... | G03F 1/36 716/50 |
| 8,479,125 B2* | 7/2013 | Pierrat | ...................... | G03F 1/36 716/50 |
| 9,310,674 B2* | 4/2016 | Azpiroz | .................... | G03F 1/76 |
| 2010/0023915 A1* | 1/2010 | Granik | ...................... | G03F 1/36 716/50 |

* cited by examiner

*Primary Examiner* — Jack Chiang
*Assistant Examiner* — Brandon Bowers
(74) *Attorney, Agent, or Firm* — Pillsbury Winthrop Shaw Pittman LLP

(57) ABSTRACT

Methods, apparatuses, and systems for determining a binary mask pattern from a pixelated mask pattern include: determining, by a processor, based on a fast marching method (FMM), arrival values for pixels of a portion of the pixelated mask pattern; determining the binary mask pattern based on the arrival values; and updating at least one of the arrival values based on a comparison between a design pattern corresponding to the pixelated mask pattern and a substrate pattern simulated based on the binary mask pattern.

20 Claims, 6 Drawing Sheets

US 10,578,963 B2

MASK PATTERN GENERATION BASED ON FAST MARCHING METHOD

TECHNICAL FIELD

This disclosure relates to mask making for manufacturing integrated circuits (ICs). More specifically, this disclosure relates to generating mask patterns based on fast marching method (FMM) and inverse lithography technology (ILT).

BACKGROUND

Lithography is a process used in semiconductor manufacturing. Desired ICs are designed as "design patterns" that include geometric features (e.g., lines, dots, and shapes) representing the circuits, and the design patterns can be transferred onto a substrate (e.g., a silicon wafer) in an optical process followed by physical and chemical processes (e.g., exposure, development, or etching) to turn the transferred patterns (referred to as "substrate patterns") into a manufactured circuit. The optical process and the following physical and chemical processes can be integrally referred to as a "pattern transfer process."

In the pattern transfer process, the design patterns can be transferred to a "photomask" (or "mask") before being transferred to the substrate. The process of transferring the design patterns onto the mask can be termed as "mask making" or "mask writing." The transferred patterns on the mask (referred to as "mask patterns") can be transferred to the substrate by illuminating the same using a light source (e.g., an ultraviolet or UV light, a deep ultraviolet or DUV light, or an extreme ultraviolet or EUV light) and projecting the transmitted light onto the substrate for exposure using an optical system.

Due to the optical resolution limitations in the pattern transfer process, the substrate patterns can have distortions compared with the mask patterns. Due to uncertainties introduced in the physical and chemical processes, defects in the substrate patterns can also occur. Based on a relationship between the mask patterns and the substrate patterns, various resolution enhancement techniques (RETs), such as optical proximity correction (OPC), can be used for the mask writing to pre-compensate and minimize such distortions and defects. However, as the semiconductor manufacturing approaches smaller nodes (e.g., 14 nanometers or below), the OPC faces more challenges due to the increasing complexity of the mask patterns.

SUMMARY

Disclosed herein are methods, apparatuses, and systems for optimizing a dose map for mask making.

In an aspect, a method for determining a binary mask pattern from a pixelated mask pattern is disclosed. The method includes determining, by a processor, based on a fast marching method (FMM), arrival values for pixels of a portion of the pixelated mask pattern; determining the binary mask pattern based on the arrival values; and updating at least one of the arrival values based on a comparison between a design pattern corresponding to the pixelated mask pattern and a substrate pattern simulated based on the binary mask pattern.

In another aspect, an apparatus for determining a binary mask pattern from a pixelated mask pattern is disclosed. The apparatus includes a processor and a memory coupled to the processor. The memory is configured to store instructions which when executed by the processor become operational with the processor to determine, based on a fast marching method (FMM), arrival values for pixels of a portion of the pixelated mask pattern; determine the binary mask pattern based on the arrival values; and update at least one of the arrival values based on a comparison between a design pattern corresponding to the pixelated mask pattern and a substrate pattern simulated based on the binary mask pattern.

In another aspect, a non-transitory computer-readable storage medium is disclosed. The non-transitory computer-readable storage medium includes instructions for determining a binary mask pattern from a pixelated mask pattern, which instructions when executed by a processor become operational with the processor to determine, based on a fast marching method (FMM), arrival values for pixels of a portion of the pixelated mask pattern; determine the binary mask pattern based on the arrival values; and update at least one of the arrival values based on a comparison between a design pattern corresponding to the pixelated mask pattern and a substrate pattern simulated based on the binary mask pattern.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
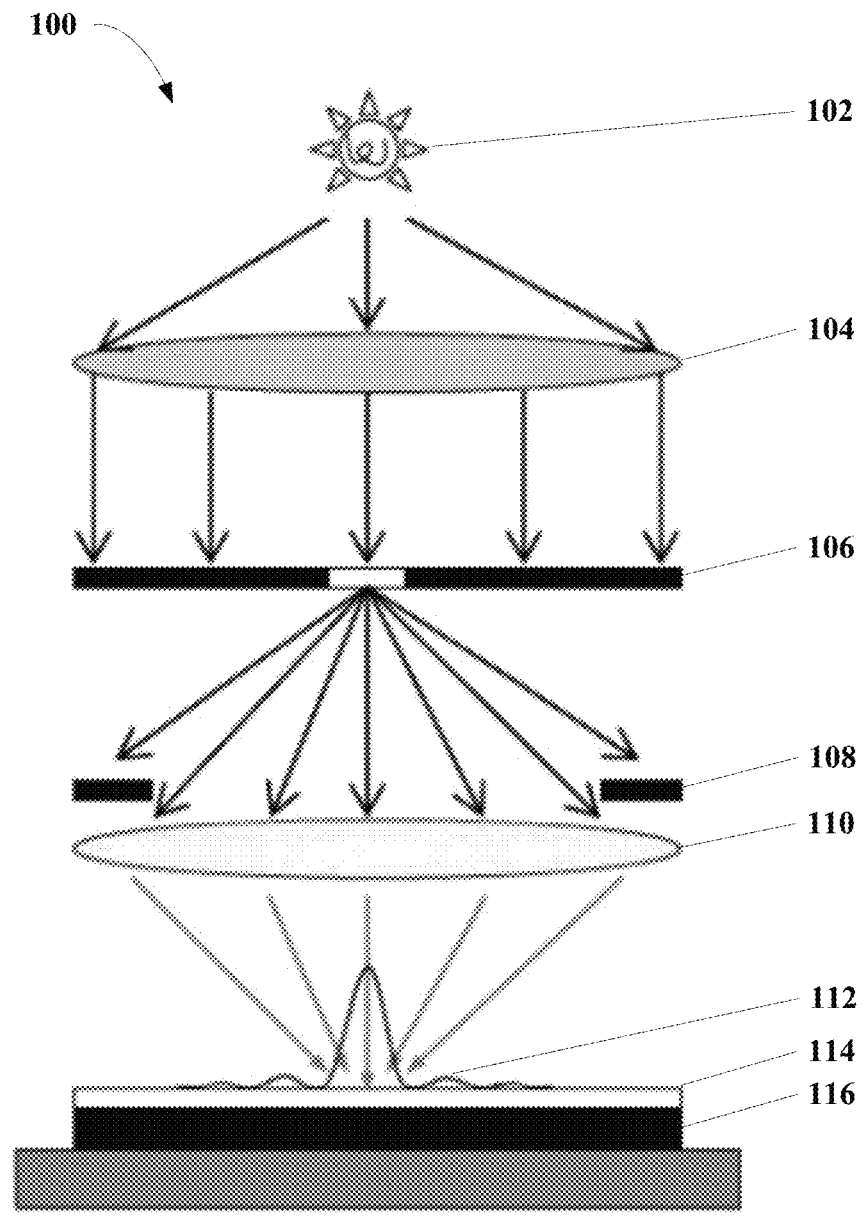
FIG. 1 shows an example lithography system.

FIG. 1 shows an example lithography system 100. The light source 102 emits light that passes through a lens system 104 (e.g., a condenser lens system). The lens system 104 can transform the light as collinear. The collinear light illuminates a mask 106. The mask 106 can include patterns or shapes (referred to as "mask patterns") representing desired shapes to be transferred onto a substrate (e.g., a silicon wafer). The material (e.g., quartz) of the mask 106 can be made to have different transmittances in different regions to represent the mask patterns. The light passing through the mask 106 carries the information of the mask patterns, which can form an image near the surface of a downstream (or "downwind") side of the mask 106, which can be referred to as a "mask image." As used herein, the term "downstream" or "downwind" refers to a direction along with the propagation of the light emitted from a light source (e.g., the light source 102). After passing through an aperture 108 and an objective lens system 110, the mask image can be focused to form an aerial image 112 (represented as intensity distributions in FIG. 2) above a photoresist 114 coated upon a substrate 116. The incident light can expose regions of the photoresist 114 that modify their chemical properties. The modified photoresist 114 can be removed by applying a chemical solution (referred to as a "developer") to the exposed regions of the photoresist 114, which exposes regions of the substrate underneath. The exposed regions of the substrate 116 can be etched (e.g., by an acid), while the unexposed regions of the substrate 116 can be protected by the unmodified regions of the photoresist 114. After the etching, the unmodified regions of the photoresist 114 can be removed by a chemical (referred to as a "resist stripper"), after which the mask patterns are transferred to the substrate (referred to as "substrate patterns").

The mask 106 can be used in optical lithography. A mask writing process can convert design patterns (e.g., including polygons) into the mask patterns. During the mask writing process, the design patterns can be transferred onto a photoresist layer of a mask blank (e.g., a quartz substrate covered with a layer of chromium) using a light beam (e.g., in a laser writer) or an e-beam (e.g., in an e-beam writer). The beam can be controlled to move across the surface of the photoresist layer in a predetermined scan manner (e.g., a raster scan manner). The photoresist on the mask can be modified. In a process similar to developing, etching, and resist stripping, the chromium layer can be etched to have the transferred design patterns that are able to transmit light.

Optical proximity correction (OPC) is one of the resolution enhancement techniques (RET) used for mask making to improve the fidelity of the substrate patterns during pattern transfer, especially for small-dimension mask patterns. Due to diffraction of light, the mask image can be different from the design patterns, which can be propagated to the aerial image. OPC can pre-compensate for such optical effects in addition to following physical and chemical effects in the pattern transfer process. OPC can modify the polygons of the mask patterns by fragmenting (or "bisecting") edges of the polygons (e.g., rectangles) into segments. For example, an edge of a polygon can be bisected into 5 or 6 segments, or a polygon can be bisected into 20 to 30 segments in total. Each segment can be a variable (referred to as an "optimization variable") for mask image optimization. The segments can be added, subtracted, moved, merged, or rotated, independently or interdependently, such as by lengthening an edge, displacing an edge (referred to as "edge-biasing"), creating serifs at corners, or adding sub-resolution assistant features (SRAFs) to the main patterns. As used herein, the term "main pattern" refers to the mask patterns to be transferred onto the substrate. The SRAFs can modify the substrate patterns in the optical process but are not transferable to the substrate.

After adjusting the segments, simulations (e.g., rule-based or model-based simulations) can be performed to simulate the substrate patterns transferred from the OPCoptimized mask patterns. For example, the polygons in the mask pattern can be rendered (also referred to as "dithered") to form a mask image, and the mask image can be transferred to be (or "transformed") to the substrate pattern in subsequent simulations. The OPC-based mask pattern optimization can be repeated until the substrate patterns are deemed as sufficiently similar to the design patterns (e.g., the difference between them falls under a threshold).

The polygons of the mask patterns typically have angles of 0° and 90° (referred to as "Manhattanized polygons"). As the semiconductor manufacturing approaches smaller nodes, free-form shapes are introduced to the design patterns for representing IC structures with small dimensions. As used herein, the term "free-form" refers to an arbitrary form of a shape, which can include curves and has no limitation on the angles of the shape. Due to limitations of manufacturing techniques, free-form shapes are difficult to transfer to the mask in mask making. To represent the free-form shape of the mask patterns, curve-linear shapes are introduced for approximating the free-form shapes. As used herein, the term "curve-linear" refers to a feature of a set of linear segments assembled with arbitrary angles for approximating a curve of a free-form shape (e.g., approximating a circle using a set of short segments connected head-to-tail).

In addition to curve-linear shapes, to cope with the optical proximity effects caused by the shrinking dimensions of the mask patterns, a first co-optimization can be performed in which the main patterns and the SRAFs are simultaneously adjusted in the OPC process. The main patterns and the SRAFs, alone or in combination, can be curve-linear.

The efficiency of OPC can deteriorate due to the introduced curve-linear shapes and the increasing complexity of the mask patterns, such as an increasing number of optimization variables (e.g., the segments), or increasing degrees of freedom (DOFs) of each variable (e.g., due to the introduction of curve-linear shapes). In addition, interdependency of the optimization variables (e.g., optical proximity effects becoming more significant due to reduced distances between the segments in an area) can increase as the dimensions of the mask pattern shrink. Therefore, a second co-optimization process can be performed to simultaneously optimize the interdependent optimization variables in an area. Due to the aforementioned reasons, it can be difficult for the OPC to perform the massive-variable optimization, the first co-optimization, and the second co-optimization effectively and efficiently.

To cope with the aforementioned difficulties, alternative computational techniques are implemented. Inverse lithography technology (ILT) is one such technique. ILT is a process window based optimization method that can be used to improve substrate pattern fidelity. As used herein, the term "process window" refers to a range of values of parameters (referred to as "process parameters"), which allows an IC to be manufactured and operate under design specifications. ILT can be used to optimize mask image for controlling process parameters of a pattern transfer process to be within a tolerance allowance. The ILT process can be implemented herein as a software or hardware module. Design patterns can be inputted to an ILT module to perform an image-based optimization for generating an optimized mask image (e.g., a high-resolution mask image). ILT can be implemented based on modeling (e.g., transformation functionals) of a lithography process. For example, the modeling can simulate electromagnetic, optical, chemical, and/or lithographic transfer effects. Because the forward transfer is many-to-one (e.g., many different mask images can produce the same substrate patterns), ILT can also be considered an optimization technique.

ILT can be used to optimize the mask patterns on a pixel level, in which the dithering of the polygons in the OPC-based optimization can be omitted. The physical size of the pixels can be determined based on a domain (e.g., a size) and fineness (i.e., resolution) of the mask image. Each pixel can be an optimization variable. By controlling the fineness of the mask image, the optimization variables (e.g., a total number of pixels) used in ILT can be fewer than the optimization variables (e.g., a total number of segments of polygons) used in OPC, by which the efficiency of mask pattern optimization can be improved.

However, for mask making (e.g., in a mask shop), the polygons of the mask patterns are still needed as an input. To provide the polygons to the mask shop, the pixelated mask image optimized using ILT can be binarized to extract the polygons. During the extraction, the polygons can be extracted as curve-linear shapes. The extracted polygons can include any generic geometric shapes, such as the main patterns and SRAFs.

Methods, apparatuses, and systems are disclosed herein for extracting binary geometric features (e.g., polygons in curve-linear shapes) from the optimized pixelated mask image. The binarized mask image can include binary (e.g., black and white) mask patterns. The binary mask patterns (e.g., main patterns and/or SRAFs) can be curve-linear. For example, the mask pattern can be determined as pixels at a boundary determined between a bright region and a dark region of the optimized mask image. The binarization can be implemented as an optimization process based on a fast marching method (FMM). The binary mask patterns can be extracted with high efficiency and high accuracy, and provided to the mask shop for mask making. The extracted mask patterns can include any combination of any number of main patterns, SRAFs, or any geometric shape. The FMM-based optimization can automatically adjust parameters for the binarization, by which the difference between the optimized mask image and an image simulated from the binary mask patterns (referred to as a "simulated substrate image") can be minimized.

FMM is a computational technique for tracking a propagating interface in a space. As used herein, the term "interface" refers to a boundary for separating the inside and outside of an arbitrary region of the space, and the term "propagation" refers to the motion of the interface. The interface and space can be of any number of dimensions. For example, in a three-dimensional (3D) space, the interface can be an enclosed surface. On a two-dimensional (2D) surface, the interface can be a contour curve. The propagation of the interface can be typically categorized into two types. The first type of propagation, in which the interface is unidirectionally (or "monotonically") expanding or contracting, can be formulated as a boundary value problem. For the second type of propagation, the interface is arbitrarily expanding or contracting (e.g., a part of the interface is expanding and another part of the interface is contracting), which can be formulated as an initial value problem. FMM is an efficient technique for solving the first type of propagation.

When applying FMM to the binarization of the optimized mask image, the space can be the mask image itself, and the interface can be a 2D contour curve that is a boundary between regions of the mask image (e.g., a bright region and a dark region). The FMM can be used for contour extraction of the mask image. The extracted boundaries can serve as the extracted mask patterns.

To describe the propagation of the interface, a description of a velocity of the interface is used in FMM. For convenience, a parameter F (e.g., a scalar-value parameter) can be used to describe the velocity of the interface in a normal direction of the interface (referred to as a "normal velocity"). F can be referred to as a "propagation speed" (or "speed" for simplicity). For the first type of propagation, F can satisfy a condition of F>0 (for monotonical expansion of the interface) or F<0 (for monotonical contraction of the interface).

The propagation of the interface can start from an initial position, such as, for example, an initial contour or an initial point (referred to as a "ridge point"). That is, when the time is at zero, the interface is at the initial position. To determine the time (referred to as an "arrival time") for the interface to propagate to (e.g., reach or sweep across) a point in the region, a relationship between the speed F and the arrival time can be used:

$$|\nabla T|F = 1 \qquad \text{Eq. (1)}$$

Eq. (1) is known as an eikonal equation, which is a form of the more generic Hamilton-Jacobi equations. The T in Eq. (1) can be referred to as a "propagation arrival time" or "arrival time" for simplicity.

The objective of FMM is to solve Eq. (1) and obtain the arrival time T for points in the space in which the interface propagates. For any given point (x, y) on a surface, T(x, y) can give the time for the interface to propagate to the point (x, y) from the initial position. For an image, each point (e.g., a pixel) of the image can be associated ("tagged" or "labeled") with a computed arrival time, and the set of {T(x, y)} for the points {(x, y)} in the image can be referred to as an "arrival time map" that maps a coordinate of a point in the image to the arrival time associated with that point. The contour extraction of the image can become a look-up operation of the propagating contour based on the coordinates of the points {(x, y)} and the arrival time map {T(x, y)}. For example, if a threshold $T_{th}$ is applied to the T(i, j) associated with a ridge point (i, j), which means the contour propagating from the ridge point (i, j) stops at the time $T_{th}$, the "frozen" contour at the time $T_{th}$ can be the extracted contour associated with the ridge point (i, j).

In some implementations, when the optimized mask image is a grayscale image, the mask patterns can be determined as the boundaries between its bright regions and dark regions. A ridge point (i, j) can be selected as the brightest or the darkest point (e.g., a pixel) in a selected region. For ease of explanation without causing ambiguity, the ridge point can be selected as the brightest point hereinafter, unless explicitly described otherwise. The values of the speed F for a pixel of the selected region can be determined based on the brightness value (hereinafter referred to as "brightness" for simplicity) of the pixel. The brightness of the pixel can depend on an intensity and/or a color of the pixel. For example, a brighter pixel can have a greater speed value, or vice versa. The arrival time T for a neighboring pixel (x, y) of the ridge point (i, j) can be determined based on the distance between the pixel (x, y) and the ridge point (i, j), and the speed values F of the points between the pixel (x, y) and the ridge point (i, j). Because the speed can be related to the brightness of the pixels, the arrival time of the neighboring pixel (x, y) can be related to its brightness. The threshold $T_{th}$ can be selected as a time duration after which the propagating contour is deemed as reaching to the boundary between a bright region and a dark region. The frozen contour at time $T_{th}$ can be determined as an extracted mask pattern.

Because FMM only considers monotonical propagation of the boundaries, the binarization can be highly efficient. The details of the binarization will be set forth in the following description.

Figure 2:
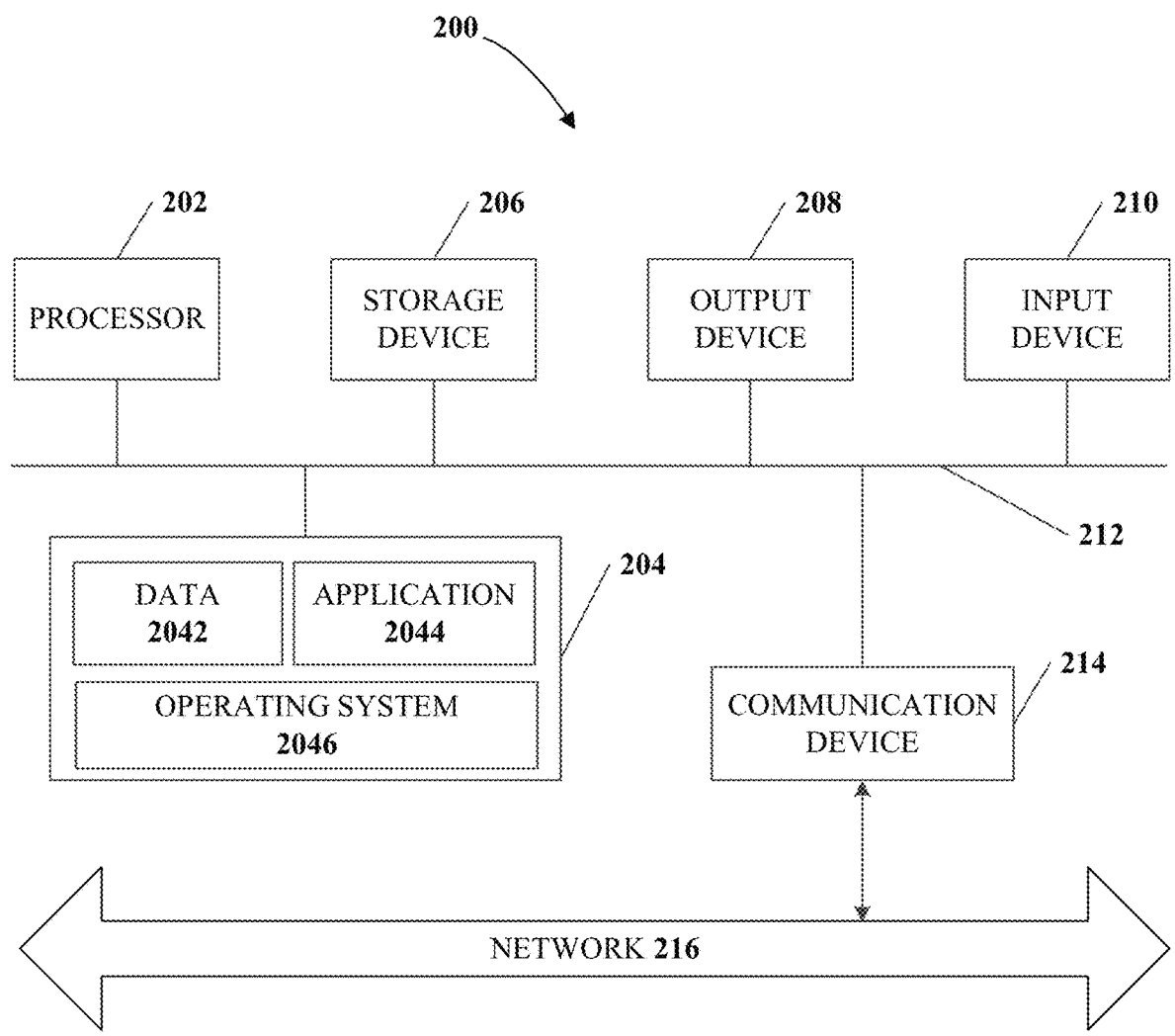
FIG. 2 is a diagram of an example apparatus for generating a dose map according to implementations of this disclosure.

FIG. 2 is a diagram of an example apparatus 200 for generating a dose map according to implementations of this disclosure. The apparatus 200 can include any number of any configurations of computing devices, such as a microcomputer, a mainframe computer, a supercomputer, a general-purpose computer, a special-purpose/dedicated computer, an integrated computer, a database computer, a remote server computer, a personal computer, or a computing service provided by a computing service provider, for example, a web host or a cloud service provider. In some implementations, the computing devices can be implemented in the form of multiple groups of computers that are at different geographic locations and can communicate with one another, such as by a network. While certain operations can be shared by multiple computers, in some implementations, different computers can be assigned to different operations. In some implementations, the apparatus 200 can be implemented using general-purpose computers/processors with a computer program that, when executed, carries out any of the respective methods, algorithms, and/or instructions described herein. In addition, for example, special-purpose computers/processors, which can contain specialized hardware for carrying out any of the methods, algorithms, or instructions described herein, can be utilized.

The apparatus 200 can have an internal configuration of hardware including a processor 202 and a memory 204. The processor 202 can be any type of device capable of manipulating or processing information. In some implementations, the processor 202 can include a central processing unit (CPU). In some implementations, the processor 202 can include a graphics processor (e.g., a graphics processing unit or GPU). For example, the GPU can provide additional graphical processing capability for at least one of ILT-based mask image generation, FMM-based binarization, mask pattern simulation, substrate pattern simulation, and binarization optimization. Although the examples herein are described with a single processor as shown, advantages in speed and efficiency can be achieved using multiple processors. For example, the processor 202 can be distributed across multiple machines or devices (in some cases, each machine or device can have multiple processors) that can be coupled directly or connected to a network. The memory 204 can be any transitory or non-transitory device capable of storing codes and data that can be accessed by the processor (e.g., via a bus). For example, the memory 204 can be accessed by the processor 202 via a bus 212. Although a single bus is shown in the apparatus 200, multiple buses can be utilized. The memory 204 herein can be a random-access memory (RAM) device, a read-only memory (ROM) device, an optical/magnetic disc, a hard drive, a solid-state drive, a flash drive, a security digital (SD) card, a memory stick, a compact flash (CF) card, or any combination of any suitable types of storage devices. In some implementations, the memory 204 (e.g., a network-based or cloud-based memory) can be distributed across multiple machines or devices. The memory 204 can store data 2042, an operating system 2046, and an application 2044. The data 2042 can be any data for processing (e.g., computerized data files or database records). The application 2044 can include programs that permit the processor 202 to implement instructions to perform functions described in this disclosure. For example, when the application 2044 is run, a set of algorithms, processes, or operations can be executed for at least one of ILT-based mask image generation, FMM-based binarization, mask pattern simulation, substrate pattern simulation, and binarization optimization.

In some implementations, in addition to the processor 202 and the memory 204, the apparatus 200 can include a secondary (e.g., additional or external) storage device 206. The secondary storage device 206 can provide additional storage capacity for high processing needs. The secondary storage device 206 can be a storage device in the form of any suitable transitory or non-transitory computer-readable media, such as a memory card, a hard disk drive, a solid-state drive, a flash drive, or an optical drive. Further, the secondary storage device 206 can be a component of the apparatus 200 or can be a shared device that can be accessed via a network. In some implementations, the application 2044 can be stored in whole or in part in the secondary storage device 206 and loaded into the memory 204. For example, the secondary storage device 206 can be used for a database.

In some implementations, in addition to the processor 202 and the memory 204, the apparatus 200 can include an output device 208. The output device 208 can be, for example, a display coupled to the apparatus 200 for displaying graphics data. If the output device 208 is a display, for example, it can be a liquid crystal display (LCD), a cathode-ray tube (CRT) display, or any other output device capable of providing a visible output to an individual. The output device 208 can also be any device capable of transmitting visual, acoustic, or tactile signals to a user, such as a touch-sensitive device (e.g., a touchscreen), a speaker, an earphone, a light-emitting diode (LED) indicator, or a vibration motor. In some implementations, the output device 208 can also function as an input device (e.g., a touchscreen display configured to receive touch-based input). For example, the output device 208 can include a display that can display images, simulation results, simulation parameters, or a combination thereof. The output device 208 can display visual data for a user (e.g., a mask design engineer) to assess the current status of the binarization optimization.

In some implementations, the output device 208 can also function as a communication device for transmitting signals and/or data. For example, the output device 208 can include a wired means for transmitting signals or data from the apparatus 200 to another device. For another example, the output device 208 can include a wireless transmitter using a protocol compatible with a wireless receiver to transmit signals from the apparatus 200 to another device.

In some implementations, in addition to the processor 202 and the memory 204, the apparatus 200 can include an input device 210. The input device 210 can be, for example, a keyboard, a numerical keypad, a mouse, a trackball, a microphone, a touch-sensitive device (e.g., a touchscreen), a sensor, or a gesture-sensitive input device. Any type of input device not requiring user intervention is also possible. For example, the input device 210 can be a communication device, such as a wireless receiver operating according to any wireless protocol for receiving signals. The input device 210 can output signals or data, indicative of the inputs, to the apparatus 200, for example, via the bus 212. For example, a user or operator can provide simulation-related information to the apparatus 200 via the input device 210. For another example, the input device 210 can also be an interface (e.g., a scanner) that can enable a user to provide design patterns to the apparatus 200 for ILT-based mask image generation.

In some implementations, in addition to the processor 202 and the memory 204, the apparatus 200 can optionally include a communication device 214 to communicate with another device. Optionally, the communication can occur via a network 216. The network 216 can include one or more communications networks of any suitable type in any combination, including, but not limited to, Bluetooth networks, infrared connections, near-field connections (NFCs), wireless networks, wired networks, local area networks (LANs), wide area networks (WANs), virtual private networks (VPNs), cellular data networks, or the Internet. The communication device 214 can be implemented in various ways, such as a transponder/transceiver device, a modem, a router, a gateway, a circuit, a chip, a wired network adapter, a wireless network adapter, a Bluetooth adapter, an infrared adapter, an NFC adapter, a cellular network chip, or any suitable type of device in any combination that can communicate with the network 216. For example, the communication device 214 can connect to a mask writer via the network 216 for sending the generated mask patterns to the mask writer (e.g., a single-beam or multi-beam mask writer). For another example, the communication device 214 can also be connected to another computing device installed with an Electronic Design Automation (EDA) tool that can generate a target substrate pattern based on one or more layers of the IC design. For another example, remote control instructions can be received by the communication device 214 from another computing device connected to the network 216 for remote control of the apparatus 200.

The apparatus 200 (with the algorithms, methods, instructions, etc., stored thereon and/or executed thereby) can be implemented as hardware modules, such as, for example, intellectual property (IP) cores, application-specific integrated circuits (ASICs), programmable logic arrays, optical processors, programmable logic controllers, microcode, firmware, microcontrollers, servers, microprocessors, digital signal processors, or any other suitable circuit. Further, portions of the apparatus 200 do not necessarily have to be implemented in the same manner.

Figure 3:
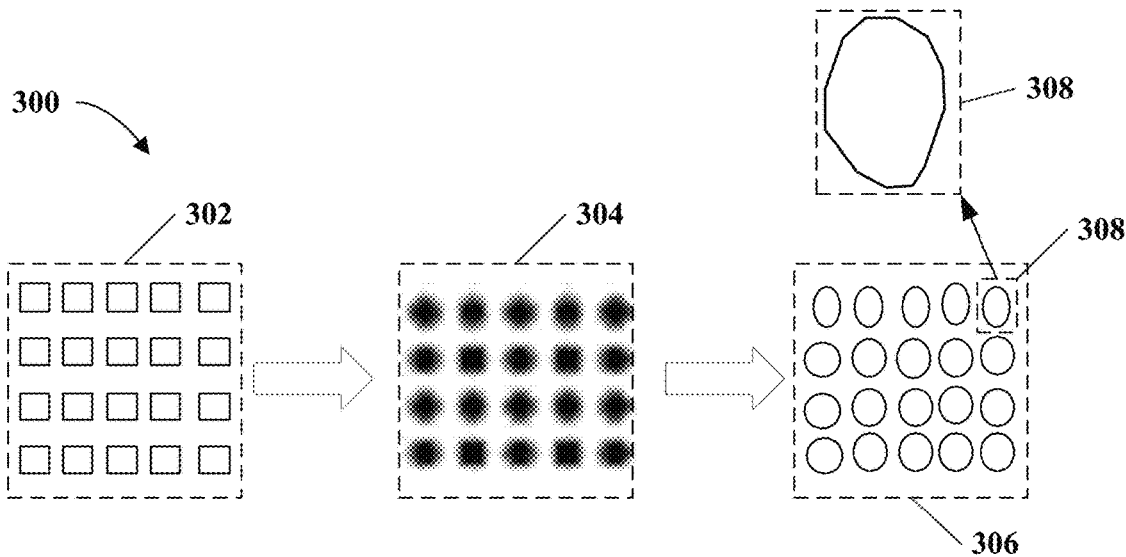
FIG. 3 is a diagram of an example process for determining a binary mask pattern according to implementations of this disclosure.

FIG. 3 is a diagram of an example process 300 for determining a binary mask pattern according to implementations of this disclosure. In the process 300, design patterns 302 can be used to determine an optimized mask image that includes optimized mask patterns 304. The optimized mask patterns 304 can be binarized to extract binary mask patterns 306. The binary mask patterns 306 can be used (e.g., provided to a mask shop) as an input for mask making.

In some implementations, the design patterns 302 can be retrieved from a database (e.g., stored in the storage device 206 of the apparatus 200). For example, the design patterns 302 can include symbolic or vectorized data (e.g., in Graphic Data System or GDS, or GDSII data format). The design patterns 302 can include any geometric shape having any geometric features (e.g., points, lines, or curves). For example, the design patterns 302 can include a set of rectangles, as shown in FIG. 3.

In some implementations, an ILT process can be used to determine the optimized mask image. The design patterns 302 can be used as input of the ILT process. The optimized mask patterns 304 can be pixelated. The optimized mask patterns 304 can be represented by black-and-white pixels, grayscale pixels, or color pixels. For example, the optimized mask patterns 304 can include a set of grayscale ellipses corresponding to the design patterns 302, as shown in FIG. 3.

For a negative mask image, the brightness of pixels is negatively correlated with the luminosity of a region illuminated by light passing through the mask. For example, dark (e.g., black or deep gray) pixels represent regions through which light passes the mask fully or partially, and bright (e.g., white or light gray) pixels represent regions in which the light is fully or partially blocked by the mask. The darker a pixel is, the brighter the point represented by the pixel is illuminated by the light. For a positive mask image, the brightness of pixels is positively correlated with the luminosity of the region illuminated by the light passing through the mask. In FIG. 3, the optimized mask image is a negative mask image, as partially shown by the optimized mask patterns 304. For ease of explanation without causing ambiguity, the mask image will be described as a negative image hereinafter unless explicitly stated otherwise.

In some implementations, the extracted binary mask patterns 306 can be curve-linear. As shown in FIG. 3, the binary mask patterns 306 can include a binary mask pattern 308. The arrow in the binary mask patterns 306 points to an enlarged diagram of the binary mask pattern 308, which shows that the binary mask pattern 308 is curve-linear.

The binary mask patterns 306 can affect the fidelity of pattern transfer. To achieve a high-fidelity pattern transfer for production-level lithography, the binary mask patterns 306 can be adjusted (e.g., by changing numbers, lengths, angles, or relative positions of segments) to pre-compensate (e.g., to cancel out as much as possible) errors caused by optical, chemical, and physical effects in the pattern transfer process. The adjustment can be implemented as an optimization process. During the optimization process, a substrate image that includes substrate patterns can be simulated using the binary mask patterns 306. The substrate patterns can be compared with the design patterns 302, and an evaluation value can be determined to represent similarity between the two. If the similarity between the design patterns 302 and the substrate patterns is deemed as insufficient (e.g., the evaluation value is below a threshold), the binary mask patterns 306 can be adjusted with the aim of increasing the similarity. The adjusted binary mask patterns 306 can be used to re-simulate the substrate image, and the optimization process can be iterated until the similarity is deemed as sufficient (e.g., the evaluation value is above or equal to a threshold). By that time, the optimized binary mask patterns 306 can be outputted for mask making.

According to the methods, apparatuses, and systems disclosed herein, the adjustment of the binary mask patterns 306 can be implemented without using OPC. The optimization process of the binary mask patterns 306 will be described as follows.

Figure 4:
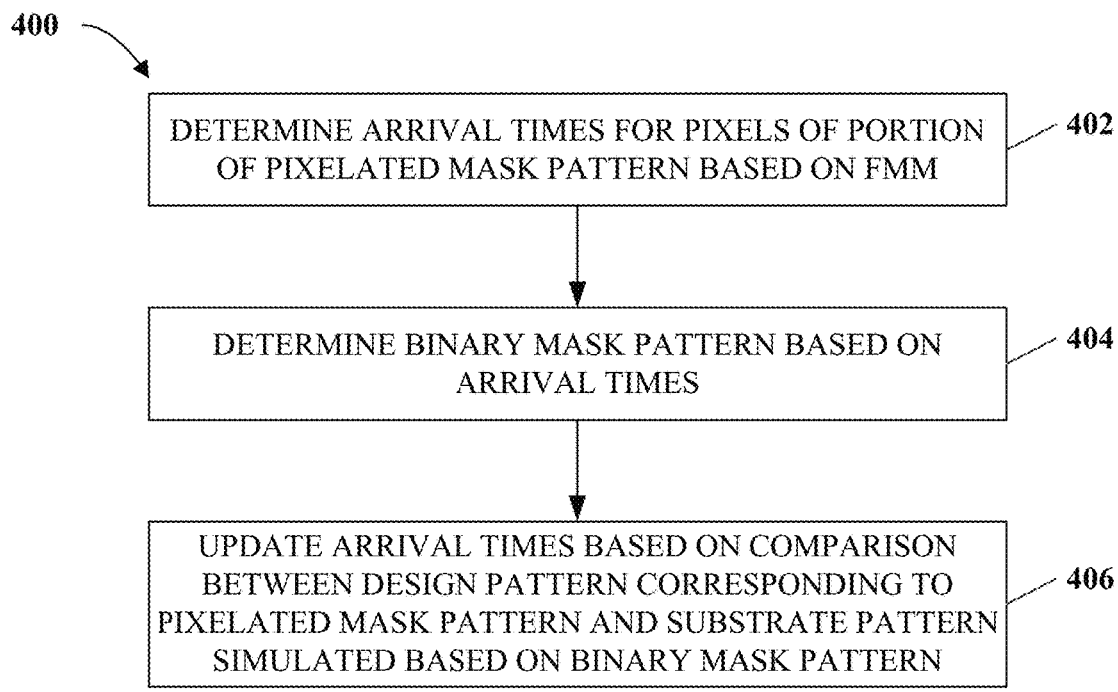
FIG. 4 is a flowchart of an example process for determining a binary mask pattern from a pixelated mask pattern according to implementations of this disclosure.

FIG. 4 is a flowchart of an example process 400 for determining a binary mask pattern from a pixelated mask pattern according to implementations of this disclosure. The process 400 can be implemented in hardware or software. For example, the process 400 can be implemented in software stored as instructions and/or data in the memory 204 and executable by the processor 202 of the apparatus 200. For another example, the process 400 can be implemented in hardware as a specialized chip storing instructions executable by the specialized chip.

At operation 402, arrival values for pixels of a portion of the pixelated mask pattern are determined based on a fast marching method (FMM). The FMM can be applied to the pixelated mask pattern to determine arrival values for points (e.g., pixels) of the pixelated mask pattern. In some implementations, the FMM can be implemented similarly to the FMM operation 602, as will be described in details below in FIGS. 6 and 8. The portion can be a partial or whole region of the pixelated mask pattern. For example, the arrival values can be the arrival times 604, as will be described in details below in FIG. 6. For another example, the pixelated mask pattern can be the optimized mask patterns 304 or the optimized mask pattern 502, as will be described in details below in FIGS. 3-5.

In some implementations, based on the FMM, a ridge point can be determined as the brightest pixel of the portion or the darkest pixel of the portion. Speed values associated with the pixels of the portion can be determined based on image characteristics of the pixels of the portion and distances between the ridge point and the pixels of the portion. The arrival values can be determined based on the speed values and the distances. For example, the ridge point can be the ridge point 802, as will be described in details below in FIG. 8. The image characteristics can include at least one of brightness of a pixel, an intensity of the pixel, a color of the pixel, and an image gradient associated with the pixel. The image gradients can be indicative of changes associated with the pixels in at least one of the brightness of the pixels, the intensities of the pixels, and the colors of the pixels.

In some implementations, the pixelated mask pattern can be determined based on the design pattern using the ILT. For example, the pixelated mask pattern can be determined using the process 700, as will be described in details below in FIG. 7.

At operation 404, the binary mask pattern can be determined based on the arrival values determined based on the FMM. In some implementations, the operation 404 can be implemented similarly to the binarization operation 504, as will be described in details below FIGS. 5-7. For example, the binary mask pattern can be the binary mask pattern 308 or the binary mask pattern 506, as will be described in details below in FIGS. 3-5. The binary mask pattern can be curve-linear. In some implementations, the binary mask pattern can include at least one of a main pattern and an SRAF.

In some implementations, a segment of the binary mask pattern can be determined as pixels of the portion having the same predetermined value as the arrival values. For example, the segment of the binary mask pattern can be determined as the contour 808, as will be described in details below in FIG. 8.

At operation 406, at least one of the arrival values is updated based on a comparison between a design pattern corresponding to the pixelated mask pattern and a substrate pattern simulated based on the binary mask pattern. In some implementations, the simulation can be implemented as the simulation operation 508, as will be described in details below in FIG. 5. For example, the comparison can be implemented similarly to the comparison operation 512, as will be described in details below in FIG. 5. The design pattern corresponding to the pixelated mask pattern can be one of the design patterns 302 or the design pattern 702, as will be described in details below in FIGS. 3 and 7. For another example, the substrate pattern can be the substrate pattern 510, as will be described in details below in FIGS. 5 and 9.

In some implementations, the comparison between the design pattern and the substrate pattern can include determining an evaluation value based on at least one of an EPE of the substrate pattern (e.g., $EPE_s$), a nominal process window condition, a MEEF, and a side-lobe printing indication value indicative of a possibility of side-lobe printing in the substrate pattern. For example, the evaluation value can be the $EPE_s$, as will be described in details below in Eqs. (2)-(5) and FIGS. 8-11.

In some implementations, when the evaluation value is greater than or equal to a predetermined threshold, the at least one of the arrival values can be updated. When the evaluation value is smaller than the predetermined threshold, the binary mask pattern can be outputted for mask making. For example, the predetermined threshold can include zero or a non-zero number.

In some implementations, the process 400 can be implemented as a software module. For example, the instructions and codes of the software module can be stored in a non-transitory computer-readable storage medium. The instructions can be executed by a processor (e.g., the processor 202 in the apparatus 200).

Figure 5:
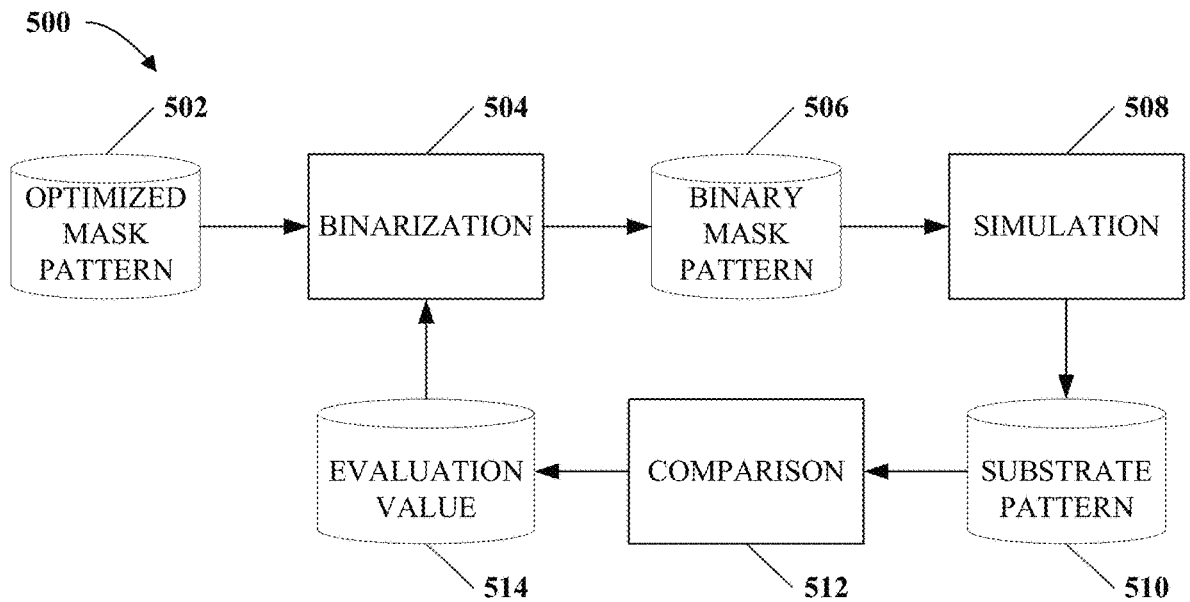
FIG. 5 is a diagram of an example process for determining a binary mask pattern according to implementations of this disclosure.
Figure 6:
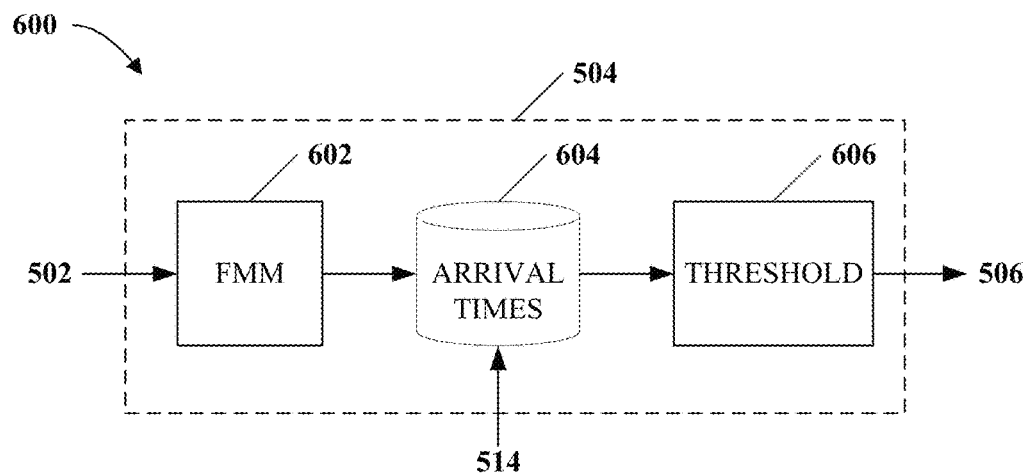
FIG. 6 is a diagram of an example process for binarizing a pixelated mask pattern according to implementations of this disclosure.
Figure 7:
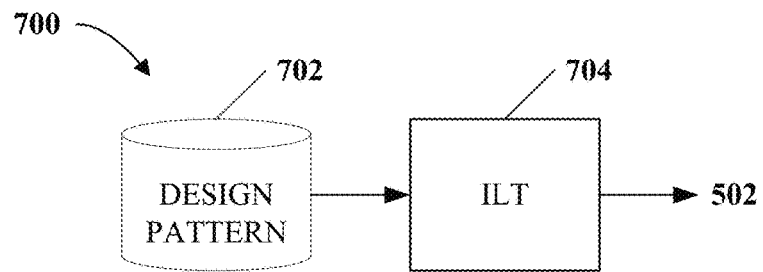
FIG. 7 is a diagram of an example process for generating an optimized mask pattern according to implementations of this disclosure.

In FIGS. 5-7, a cylinder shape represents an operable object (e.g., data as input or output of an operation), and a box shape represents an operation or step. FIG. 5 is a diagram of an example process 500 for determining a binary mask pattern from a pixelated mask pattern according to implementations of this disclosure. In the process 500, an optimized mask pattern 502 can be binarized through a binarization operation 504 to extract a binary mask pattern 506. For example, the optimized mask pattern 502 can be one of the optimized mask patterns 304 in FIG. 3. The binary mask pattern 506 can be one of the binary mask patterns 306 in FIG. 3. The binary mask pattern 506 can be simulated in a simulation operation 508 to form a simulated substrate pattern (hereinafter referred to as a "substrate pattern" for simplicity) 510. The substrate pattern 510 can be compared with a design pattern (not shown) corresponding to the optimized mask pattern 502 in a comparison operation 512 to generate an evaluation value 514. The evaluation value 514 can be used for determining whether the substrate pattern 510 and the design pattern are sufficiently similar. If the substrate pattern 510 and the design pattern are deemed as not sufficiently similar, a parameter of the binarization operation 504 can be adjusted (e.g., by updating a value of the parameter), and the binary mask pattern 506 can be re-generated. The elements 504-514 can be iterated as an optimization process until a condition is met (e.g., the substrate pattern 510 and the design pattern are deemed as sufficiently similar). When the condition is met, the binary mask pattern 506 generated in the last iteration can be outputted for mask making.

In some implementations, the optimized mask pattern 502 can be generated using the design pattern. FIG. 7 is a diagram of an example process 700 for generating the optimized mask pattern 502 from a design pattern 702 according to implementations of this disclosure. The design pattern 702 can correspond to the optimized mask pattern 502. For example, the design pattern 702 can be one of the design patterns 302 in FIG. 3. The design pattern 702 can be used as input for an ILT operation 704 to generate the optimized mask pattern 502. A mask image can be generated and optimized by the ILT operation 704. The mask image can be optimized on a pixel level (i.e., the optimized mask image is pixelated, such as a bitmap image). The optimized mask image can include the optimized mask pattern 502.

It should be noted that the process 700 is optional for the process 500. In some implementations, the process 500 and the process 700 can be combined as an integral process. In some implementations, the process 700 can be independently implemented by a third party that can provide the optimized mask patterns 502 as an input to the process 500.

Referring back to FIG. 5, in some implementations, the binarization operation 504 can use FMM for binary mask pattern extraction. FIG. 6 is a diagram of an example process 600 for binarizing a pixelated mask pattern according to implementations of this disclosure. The pixelated mask pattern can be the optimized mask pattern 502. As shown in FIG. 6, elements 602-606 of the process 600 can be an example implementation of the binarization operation 504. In FIG. 6, an FMM operation 602 can be applied to the optimized mask pattern 502 to determine arrival times 604 for points (e.g., pixels) of the optimized mask pattern 502. The arrival times 604 can be determined for some or all of the points of the optimized mask pattern 502. In some implementations, an arrival time map can be generated based on the arrival times 604. For example, the arrival time map can be an aggregated set of the arrival times that can be represented in a 3D space. A threshold can be applied to the arrival time map at a thresholding operation 606 to generate the binary mask pattern 506.

Figure 8:
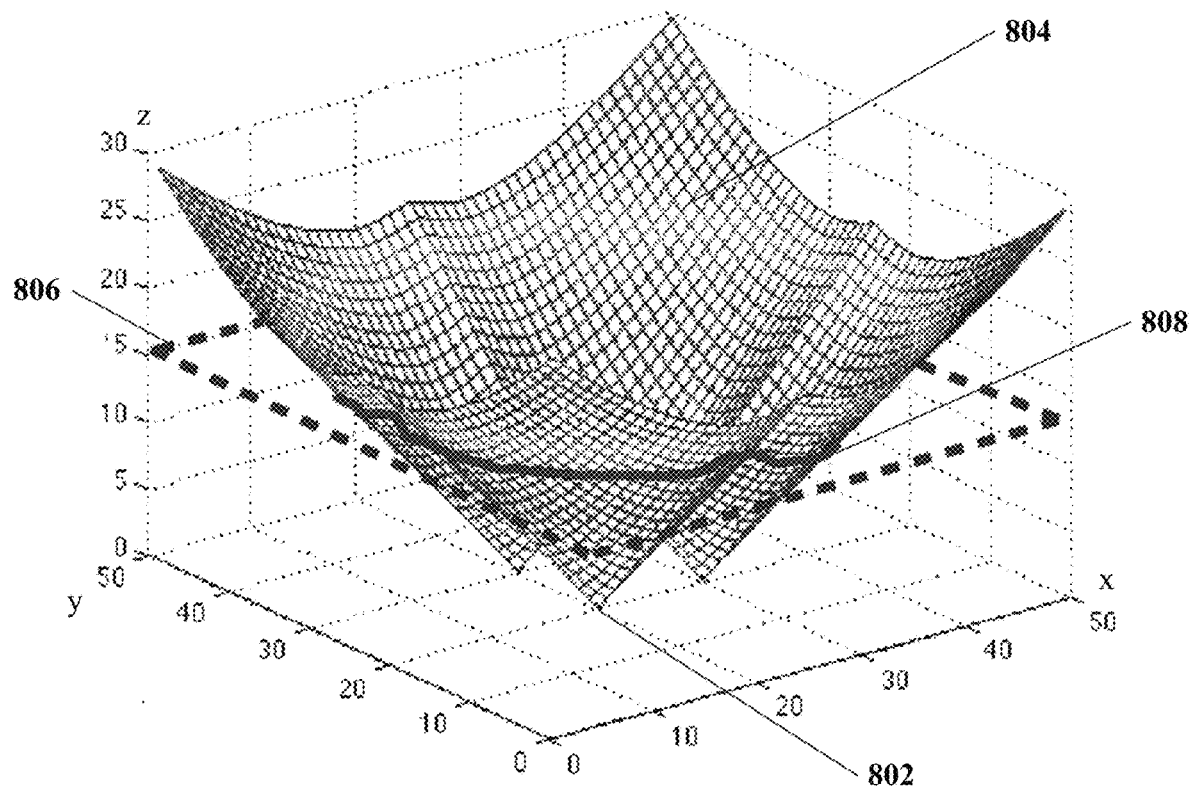
FIG. 8 is a diagram of an example arrival time map according to implementations of this disclosure.

The binarization operation 504 in FIG. 7 can be illustrated in FIG. 8. FIG. 8 is a diagram of an example arrival time map generated based on the arrival times 604. To start the FMM operation 602, a ridge point 802 can be determined in the optimized mask pattern 502. The ridge point 802 can have the maximum or minimum value (e.g., grayscale values) within a considered region. The ridge point 802 can include one or more pixels. For example, the ridge point 802 can be the darkest pixel or pixels for a negative mask image. The ridge point 802 can be the brightest pixel or pixels for a positive mask image. The considered region can be a portion of the optimized mask pattern. The considered region can also be a whole region of the optimized mask pattern. In some implementations, one ridge point can be determined for one optimized mask pattern (i.e., the optimized mask pattern includes only one considered region). In some implementations, multiple ridge points can be determined for one optimized mask pattern (i.e., the optimized mask pattern can include multiple considered regions). For an optimized mask image (not shown) including multiple optimized mask patterns, multiple ridge points can be determined.

After the ridge point 802 is determined, the FMM can be implemented to generate an arrival time map 804 associated with the ridge point 802. The arrival time map 804 can be illustrated in a 3D coordinate system. In FIG. 8, the x-y plane represents the 2D pixelated optimized mask pattern 502. Each pixel of the optimized mask pattern 502 can have a coordinate value pair (x, y) that represents its location in the x-y plane. The ridge point 802 is on the x-y plane. The z-axis represents arrival times associated with the pixels of the optimized mask pattern 502. For example, for each pixel on the x-y plane, an arrival time can be determined ("tagged") for that pixel using FMM. For example, the speed for the pixel can be determined based on an image characteristic (e.g., brightness). The image characteristics can include at least one of brightness of the pixel, an intensity of the pixel, a color of the pixel, and an image gradient associated with the pixel. The image gradients can be indicative of a change (e.g., a change rate) associated with the pixel in at least one of the brightness of the pixel, the intensity of the pixel, and the color of the pixel. The arrival time can be determined using a relationship between the speed of the pixel and a distance between the pixel and the ridge point 802. For example, if the speed is determined based on the image gradient, speeds of the pixels on the actual edges or boundaries of the optimized mask pattern can be determined as zeroes or very small values, and the arrival times for those pixels can be determined as infinity or very large values. The value of the arrival time can be plotted in the x-y-z space, which can form the arrival time map 804. For any point in the arrival time map 804, the coordinates (x, y) represent a point (x, y) in the optimized mask pattern 502, and the coordinate z represents the arrival time associated with the point (x, y) determined using FMM.

After the arrival time map 804 is determined, an arrival-time threshold (hereinafter referred to as a "threshold" for simplicity) 806 can be applied to determine the binary mask pattern 506. The application of the threshold 806 can be an example implementation of the thresholding operation 606. Within the context of FMM, the binary mask pattern 506 can be deemed as an interface that separates the optimized mask pattern 502 from the remaining portions of the optimized mask image. For example, when the speeds of the pixels are determined based on their image gradients of brightness, the arrival times can be deemed as indicative of rates of brightness changes of the pixels. That is, the arrival times can be indicative of probabilities of the pixels residing on an actual edge or boundary of the optimized mask pattern. The application of the threshold 806 to the arrival time map 804 can be deemed as an operation of selecting pixels having a specific rate of brightness change as the pixels in the binary mask pattern 506.

The threshold 806 can be represented as an intersecting plane shown in dashed lines in FIG. 8. The intersecting plane can be parallel to the x-y plane. The threshold 806 can intersect the arrival time map 804 at a contour 808 (not fully shown). The binary mask pattern 506 can be determined as the contour 808. For example, the arrival times in the arrival time map 804 can have values ranging from a first number (e.g., 0) to a second number (e.g., 1), and the threshold 806 can be selected as a third number (e.g., 0.5). Any pixel in the optimized mask pattern 502 having an arrival time smaller than or equal to the third number can be deemed as being within the optimized mask pattern 502. Any pixel having an arrival time greater than the third number can be deemed as being outside the optimized mask pattern 502. The binary mask pattern 506 can be determined as pixels having an arrival time equal to the third number.

Referring back to FIG. 5, after the binary mask pattern 506 is extracted from the optimized mask pattern 502, the simulation operation 508 can be performed to generate the substrate pattern 510. For example, the binary mask pattern 506 can be dithered to generate a pixelated mask pattern. The dithering process can convert a 2D polygon into a pixelated pattern, and can be used to simulate the mask image from polygonal mask patterns (e.g., the binary mask pattern 506) in a lithography process. The pixelated mask pattern can be used for simulating the substrate pattern 510. The substrate pattern 510 can be pixelated.

In some implementations, the simulation operation 508 can be performed using a model. The model can receive inputs that can include the binary mask pattern 506 and one or more process parameters. The process parameters can depend on different semiconductor fabrication plants and/or different lithography machines. The model can be used to simulate the optical, physical, and chemical effects of the pattern transfer process. For example, an optical transfer function can be used to simulate transforming the binary mask pattern 506 to an aerial image (e.g., the aerial image 112), and a physical and chemical simulation can be performed to transform the aerial image to the substrate pattern 510. For example, the physical and chemical simulation can simulate at least one of developing, etching, and resist stripping. The process parameters can be inputted to the model (e.g., the optical transfer function) for simulating optical distortions and/or physical limitations (e.g., resolution loss due to high-order diffractions) in the pattern transfer process.

Different kinds of models can be used for the simulation operation 508 depending on different circumstances. For example, when available, a model that simulates some or all aspects of the IC manufacturing process (e.g., optical processes, aerial image formation, and resist image formation) can be used. When such a model is not available (e.g., during an early development stage of a new manufacturing process), a substrate-manufacturing model that mainly or only simulates optical processes can be used (e.g., as a tradeoff for investigating the feasibility of the new manufacturing process). For another example, as the development progresses and models with higher accuracy become available, those models can be used for the simulation operation 508 to improve performance.

After the substrate pattern 510 is generated, it can be compared with the design pattern corresponding to the optimized mask pattern 502 (e.g., the design pattern 702 in FIG. 7) at the comparison operation 512 to determine the evaluation value 514. The evaluation value 514 can represent the similarity between the substrate pattern 510 and the design pattern.

In some implementations, the evaluation value can be determined based on an edge placement error (EPE) of the substrate pattern (referred to as $EPE_s$). The EPE is a shape error that measures normal distances (i.e., distances measured in directions perpendicular to edges) from edges of a design pattern to a point on the substrate pattern. The normal distances can have positive values or negative values. For example, a positive or negative value of a normal distance can represent that the corresponding point on the substrate pattern is outside or inside the design pattern, respectively, or vice versa. The EPE can be a scalar value determined based on values of the normal distances. The EPE can indicate similarity between the design pattern and the substrate pattern. For example, the smaller the EPE value is, the greater the similarity is between the substrate pattern and the design pattern.

Figure 9:
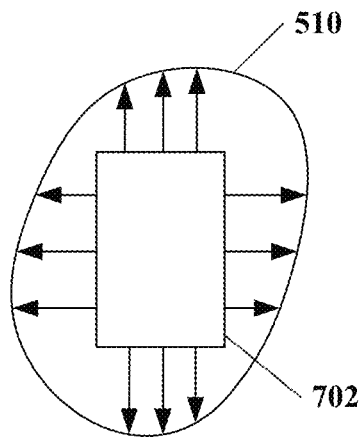
FIG. 9 is an example diagram of edge placement error of a substrate pattern according to implementations of this disclosure.

FIG. 9 is an example diagram of determining the evaluation value 514 based on $EPE_s$. The substrate pattern 510 is compared with the design pattern 702. The design pattern 702 can correspond to the optimized mask pattern 502. The substrate pattern 510 is simulated using the optimized mask pattern 502. The normal distances are shown as arrows in FIG. 9. $EPE_s$ can be determined based on the normal distances. For example, $EPE_s$ can be determined as a sum of squares of the values of the normal distances. For another example, $EPE_s$ can be determined as a sum of absolute values of the values of the normal distances.

The value of EPE can depend on a sampling scheme. The sampling scheme can indicate numbers and distributions of control points on a design pattern for computation of the EPE. A control point can be a sampling point that is selected for measuring a normal distance. For example, as shown in FIG. 9, three control points are used for each edge of the design pattern 702 to determine $EPE_s$. It should be noted that, for any edge of a design pattern (e.g., the design pattern 702), the sampling scheme can be various (e.g., the edge can include any number of control points, or the control points of the edge can have non-equal spacing in between) and is not limited to the examples described herein.

In some implementations, $EPE_s$ can include contributions from multiple process conditions, such as, for example, a nominal process window condition or a mask error enhancement factor (MEEF). It should be noted that the evaluation value can be determined based on other parameters in addition to EPE. For example, the evaluation value can also be determined based on a side-lobe printing indication value indicative of a possibility of side-lobe printing in the substrate pattern. Side-lobe printing is a physical effect of the pattern transfer caused by the Gibbs phenomenon. The transferred main pattern can have a surrounding ring-shape pattern, which is termed as "side-lobe printing." One of the goals of high-fidelity pattern transfer is to prevent or minimize side-lobe printing. The side-lobe printing indication value can be used as a basis for adjusting the evaluation value. In some implementations, the evaluation value can be a weighted sum of $EPE_s$ and the side-lobe printing indication value.

Referring back to FIG. 5, after the evaluation value is determined, it can be determined whether the substrate pattern 510 and the design pattern are sufficiently similar. For example, if the evaluation value is selected as $EPE_s$, it can be compared with a predetermined EPE threshold value. If $EPE_s$ is greater than or equal to the predetermined EPE threshold value, the substrate pattern 510 can be determined as being not sufficiently similar to the design pattern, and the process 500 can return to the binarization operation 504 for adjusting a parameter thereof. This iteration can be performed until a termination condition is met. For example, if $EPE_s$ is smaller than the predetermined EPE threshold value, the process 500 can be terminated, and the binary mask pattern 506 generated in the last iteration can be outputted for mask making. For another example, if the iteration is performed for a duration exceeding a predetermined time threshold, the process 500 can be terminated, and no binary mask pattern will be outputted.

In some implementations, if the binarization operation 504 is implemented as the process 600, the process 500 can proceed to adjusting a value of the arrival times 604, as shown in FIG. 6. In the process 600, the FMM operation 602 can be skipped. If the process 700 is integrated with the process 600, the ILT operation 704 can also be skipped. By skipping the FMM operation 602 and/or the ILT operation 704 and directly adjusting the arrival times 604, some operations of the binarization operation 504 can be bypassed, which can reduce computation time and resources and increase the overall optimization efficiency.

In the optimization process disclosed herein, the arrival-time threshold (e.g., the threshold 806) can be a predetermined constant value (e.g., a constant value), and the arrival time map (e.g., the arrival time map 804) can be adjusted. That is, the arrival times are the subjects of the optimization. For example, the optimization process can be deemed as holding the threshold 806 constant and adjusting the arrival time map 804 (e.g., by moving it up and down or changing its profile). Compared with an optimization process that holds the arrival times as constants and adjusts the arrival-time threshold (e.g., by moving it up and down), in which only the arrival-time threshold is used as the optimization variable, the disclosed optimization process can use many more optimization variables (e.g., each pixel can be an optimization variable). By using more optimization variables, the optimization results can be greatly improved (e.g., $EPE_s$ can be minimized to a greater extent). Also, compared with an optimization process that adjusts the design shapes for optimizing the dose map, the disclosed optimization process can adjust the arrival time map directly, which can save significant computation time.

The arrival times (e.g., the arrival times 604) can be updated using any optimization method. In some implementations, the arrival times can be optimized using a gradient-based optimization method. The gradient-based optimization method can include Newton's method, a quasi-Newton method, a gradient descent method, a conjugate gradient method, or any combination of any optimization methods that use a gradient of the optimization variables.

In some implementations, the arrival times can be updated using a quasi-Newton method, such as a Broyden-Fletcher-Goldfarb-Shanno (BFGS) method. For example, to optimize the arrival times for a minimized $EPE_s$, a termination condition can be used:

$$\frac{\partial EPE_s}{\partial T_{x,y}} = 0, \text{ for any } T_{x,y} \in \{T_{x,y}\} \qquad \text{Eq. (2)}$$

In Eq. (2), $\{T_{x,y}\}$ is the arrival time map (e.g., the arrival time map 804). $T_{x,y}$ belongs to $\{T_{x,y}\}$ and is the arrival time associated with the pixel having a coordinate (x, y).

$$\frac{\partial EPE_s}{\partial T_{x,y}}$$

can be referred to as a sensitivity of $EPE_s$ with respect to $T_{x,y}$ (or "sensitivity" hereinafter for simplicity). Using the BFGS method, $T_{x,y}$ can be iteratively determined as:

$$T_{x,y}^{i+1} = T_{x,y}^i - a \cdot \frac{\partial EPE_s}{\partial T_{x,y}^i} \bigg/ \frac{\partial^2 EPE_s}{\partial (T_{x,y}^i)^2} \qquad \text{Eq. (3)}$$

In Eq. (3), $T_{x,y}^i$ represents a value of $T_{x,y}$ in the $i^{th}$ iteration (e.g., i=1, 2, 3, . . . ), and $T_{x,y}^{i+1}$ represents a value of $T_{x,y}$ in the $(i+1)^{th}$ iteration.

$$\frac{\partial^2 EPE_s}{\partial (T_{x,y}^i)^2}$$

is the second-order derivative of $EPE_s$ with respect to $T_{x,y}^i$, or a first-order derivative of the sensitivity. By using the BFGS method, $$\frac{\partial^2 EPE_s}{\partial (T_{x,y}^i)^2}$$

can be determined based on an approximation of the sensitivity without performing the second-order differential computation (e.g., Hessian computation), which will not be detailed herein. In Eq. (3), a is a "slack variable" used for controlling the iteration, which can be an inputted parameter. The value of a can be updated during the iteration (e.g., depending on the precision of $T_{x,y}$).

The sensitivity can be difficult to compute directly; it is easier to determine using an indirect method. The sensitivity can be deemed as an aggregated error that includes errors occurring in the process from the binarization to the formation of the substrate pattern. The sensitivity can have several sources of contributions. For example, in some implementations, the sources of contributions can be categorized into errors occurring in the binarization process (e.g., from the thresholding of the arrival time map), deformation occurring in the dithering process (e.g., from the dithering of the binary mask pattern), and distortion occurring in the optical process (e.g., from the transferring of the dithered pixelated mask pattern onto the substrate through an optical system).

For example, the sensitivity can be broken down into the following computable terms according to a chain rule:

$$\frac{\partial EPE_s}{\partial T_{x,y}} = \frac{\partial EPE_s}{\partial MI} \cdot \frac{\partial MI}{\partial EPE_m} \cdot \frac{\partial EPE_m}{\partial T_{x,y}} \qquad \text{Eq. (4)}$$

In Eq. (4), MI represents the pixelated mask pattern determined by dithering the binary mask pattern 506, and $$\frac{\partial EPE_s}{\partial MI}$$

can represent the contribution from the distortion occurring in the optical process, which can be termed as an "optical filter." The optical filter can be computable, such as, for example, based on the optical transfer function.

$$\frac{\partial MI}{\partial EPE_m}$$

can represent the contribution from the deformation occurring in the dithering process, which can be termed as a "linear filter," a "dithering filter," or a "smoothing filter."

$$\frac{\partial EPE_m}{\partial T_{x,y}}$$

can represent the contribution from the binarization process, which can be termed as a "binarization filter." It should be noted that the optical filter, the linear filter, and the binarization filter are computable terms that can have various implementations and are not limited to the example forms shown in Eq. (4). In addition, the sensitivity can be broken into various combinations of computable terms, which are not limited to the three terms shown in Eq. (4).

Figure 10:
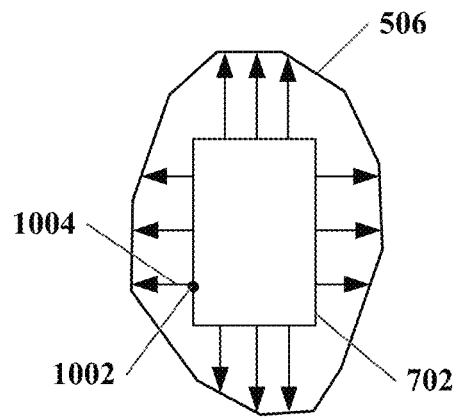
FIG. 10 is an example diagram of edge placement error of a binary mask pattern according to implementations of this disclosure.

In Eq. (4), $EPE_m$ is the EPE of the binary mask pattern 506. FIG. 10 is an example diagram of the EPE of the binary mask pattern 506 with respect to a design pattern 702 according to implementations of this disclosure. Compared with FIG. 9, the determination of $EPE_m$ can be similar to that of $EPE_s$, in which the substrate pattern 510 is substituted for the binary mask pattern 506. As shown in FIG. 10, the binary mask pattern 506 can be curve-linear.

In some implementations, due to the fact that the binary mask pattern 506 is determined from thresholding the arrival time map 804, $EPE_m$ can be determined without actually measuring the normal distances. A predicted EPE value can be determined as a difference between a nominal distance and a distance from an evaluation shape to an edge of a design shape. For example, as shown in FIG. 10, a control point 1002 on the design pattern 702 is shown. To determine $EPE_m$, a normal distance 1004 associated with the control point 1002 is to be determined. The normal distance 1004 D can be determined as:

$$D = -\frac{T_{int} - T_{th}}{T'_{int}} \qquad \text{Eq. (5)}$$

In Eq. (5), $T_{th}$ is the arrival-time threshold (e.g., the threshold 806), $T_{int}$ is an arrival time of an interpolation point at the arrival time map (e.g., the arrival time map 804) interpolated from a control point (e.g., the control point 1002), and $T'_{int}$ is the slope of a tangential plane crossing the interpolation point. Eq. (5) can be illustrated in FIG. 11.

Figure 11:
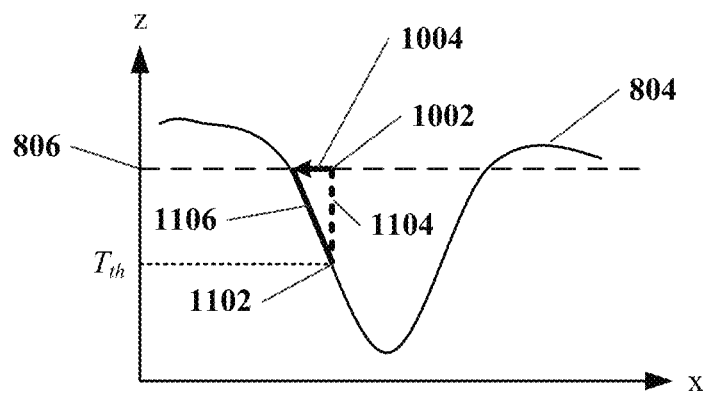
FIG. 11 is an example diagram of determining an edge placement error of a binary mask pattern according to implementations of this disclosure.

FIG. 11 is an example diagram of determining $EPE_m$ according to implementations of this disclosure. FIG. 11 can be seen as a cross-section of the arrival time map 804. The cross-sectional plane is perpendicular to the y-axis. $T_{th}$ is shown as the threshold 806. An interpolation point 1102 is interpolated from the control point 1002 to the arrival time map 804, which has the arrival time $T_{int}$. $T_{int}-T_{th}$ is shown as a dashed line 1104 between the control point 1002 and the interpolation point 1102. $T'_{int}$ is the slope of a tangential plane 1106 (perpendicular to the x-z plane) crossing the interpolation point 1102. The normal distance 1004 in FIG. 11 can be determined using Eq. (5). Similar techniques can be used to determine other normal distances, as shown in FIG. 10, which can be further used to determine $EPE_m$. As shown in Eq. (5) and FIGS. 9-11, $EPE_m$ can be determined without measuring the normal distances.

According to the above descriptions, the sensitivity $$\frac{\partial EPE_s}{\partial T_{x,y}}$$

can be determined based on Eq. (4) and Eq. (5). Based on the sensitivity, the arrival times can be updated in an iteration using Eq. (3). In some implementations, the iteration can be terminated when the termination condition Eq. (2) is met. In some implementations, the iteration can be terminated when the sensitivity is minimized to a non-zero value. By implementing the above processes, errors of the pattern transfer process (e.g., numerical errors in the dithering process and/or the simulation process) can be integrated into the optimization process for the arrival times, which can be pre-compensated (e.g., canceled out) when the arrival times are optimized.

As described above, it should be noted that all or a portion of the aspects of the disclosure described herein can be implemented using a general-purpose computer/processor with a computer program that, when executed, carries out any of the respective techniques, algorithms, and/or instructions described herein. In addition, or alternatively, for example, a special-purpose computer/processor, which can contain specialized hardware for carrying out any of the techniques, algorithms, or instructions described herein, can be utilized.

The implementations of apparatuses as described herein (and the algorithms, methods, instructions, etc., stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing, either singly or in combination. The terms "signal" and "data" are used interchangeably. Further, portions of the apparatuses do not necessarily have to be implemented in the same manner.

The aspects of the disclosure described herein can be described in terms of functional block components and various processing operations. The disclosed processes and sequences can be performed individually or in any combination. Functional blocks can be realized by any number of hardware and/or software components that perform the specified functions. For example, the described aspects can employ various integrated circuit components (e.g., memory elements, processing elements, logic elements, look-up tables, and the like), which can carry out a variety of functions under the control of one or more microprocessors or other control devices. Similarly, where the elements of the described aspects are implemented using software programming or software elements, the disclosure can be implemented with any programming or scripting languages, such as C, C++, Java, assembler, or the like, with the various algorithms being implemented with any combination of data structures, objects, processes, routines, or other programming elements. Functional aspects can be implemented in algorithms that execute on one or more processors. Furthermore, the aspects of the disclosure can employ any number of techniques for electronics configuration, signal processing and/or control, data processing, and the like. The words "mechanism" and "element" are used broadly and are not limited to mechanical or physical implementations or aspects, but can include software routines in conjunction with processors, etc.

Implementations or portions of implementations of the disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or semiconductor device, such as a hard disk drive, a memory device, a solid-state drive, a flash drive, or an optical drive. Other suitable mediums are also available. Such computer-usable or computer-readable media can be referred to as non-transitory memory or media. Unless otherwise specified, a memory of an apparatus described herein does not have to be physically contained in the apparatus, but can be a memory that can be accessed remotely by the apparatus, and does not have to be contiguous with other memory that might be physically contained by the apparatus.

Any of the individual or combined functions described herein as being performed as examples of the disclosure can be implemented using machine-readable instructions in the form of code for the operation of any or any combination of the aforementioned computational hardware. The computational code can be implemented in the form of one or more modules by which individual or combined functions can be performed as a computational tool, the input and output data of each module being passed to/from one or more further modules during operation of the methods, apparatuses, and systems described herein.

Information, data, and signals can be represented using a variety of different technologies and techniques. For example, any data, instructions, commands, information, signals, bits, symbols, and chips referenced herein can be represented by voltages, currents, electromagnetic waves, magnetic fields or particles, optical fields or particles, other items, or a combination of the foregoing.

The particular aspects shown and described herein are illustrative examples of the disclosure and are not intended to otherwise limit the scope of the disclosure in any way. For the sake of brevity, electronics, control systems, software development, and other functional aspects of the systems (and components of the individual operating components of the systems) cannot be described in detail herein. Furthermore, the connecting lines or connectors shown in the various figures presented are intended to represent example functional relationships and/or physical or logical couplings between the various elements. Many alternative or additional functional relationships, physical connections, or logical connections can be present in a practical device.

The word "example" is used herein to mean serving as an example, instance, or illustration. Any aspect or design described herein as "example" is not necessarily to be construed as being preferred or advantageous over other aspects or designs. Rather, use of the word "example" is intended to present concepts in a concrete fashion. As used in this disclosure, the term "or" is intended to mean an inclusive "or" rather than an exclusive "or" for the two or more elements it conjoins. That is, unless specified otherwise or clearly indicated otherwise by the context, "X includes A or B" is intended to mean any of the natural inclusive permutations thereof. In other words, if X includes A; X includes B; or X includes both A and B, then "X includes A or B" is satisfied under any of the foregoing instances. Similarly, "X includes one of A and B" is intended to be used as an equivalent of "X includes A or B." The term "and/or" as used in this disclosure is intended to mean an "and" or an inclusive "or." That is, unless specified otherwise or clearly indicated otherwise by the context, "X includes A, B, and/or C" is intended to mean that X can include any combinations of A, B, and C. In other words, if X includes A; X includes B; X includes C; X includes both A and B; X includes both B and C; X includes both A and C; or X includes all of A, B, and C, then "X includes A, B, and/or C" is satisfied under any of the foregoing instances. Similarly, "X includes at least one of A, B, and C" is intended to be used as an equivalent of "X includes A, B, and/or C." In addition, the articles "a" and "an" as used in this application and the appended claims should generally be construed to mean "one or more" unless specified otherwise or clear from the context to be directed to a singular form. Moreover, use of the term "an aspect" or "one aspect" throughout this disclosure is not intended to mean the same aspect or implementation unless described as such.

The use of "including" or "having" and variations thereof herein is meant to encompass the items listed thereafter and equivalents thereof as well as additional items. Unless specified or limited otherwise, the terms "mounted," "connected," "supported," "coupled," and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein is merely intended to serve as a shorthand method of referring individually to each separate value falling within the range, unless otherwise indicated herein, and each separate value is incorporated into the specification as if it were individually recited herein. Finally, the operations of all methods described herein are performable in any suitable order unless otherwise indicated herein or otherwise clearly contradicted by the context. The use of any and all examples, or language indicating that an example is being described (e.g., "such as"), provided herein is intended merely to better illuminate the disclosure and does not pose a limitation on the scope of the disclosure unless otherwise claimed.

It should be understood that although this disclosure uses terms such as "first," "second," "third," etc., the disclosure should not be limited by these terms. These terms are used only to distinguish similar types of information from each other. For example, without departing from the scope of this disclosure, a first information can also be referred to as a second information; and similarly, a second information can also be referred to as a first information. Depending on the context, the word "if" as used herein can be interpreted as "when," "while," or "in response to."

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation as is permitted under the law so as to encompass all such modifications and equivalent arrangements.

What is claimed is:

1. A method for determining a binary mask pattern from a pixelated mask pattern, the method comprising:
   determining, by a hardware processor and based on a fast marching method (FMM), arrival values for pixels of a portion of the pixelated mask pattern;
   determining the binary mask pattern based on the arrival values determined based on the FMM; and
   updating at least one of the arrival values based on a comparison between a design pattern corresponding to the pixelated mask pattern and a substrate pattern simulated based on the binary mask pattern.

2. The method of claim 1, wherein the comparison between the design pattern and the substrate pattern further comprises determining an evaluation value based on at least one selected from: an edge placement error (EPE) of the substrate pattern, a nominal process window condition, a mask error enhancement factor (MEEF), and/or a side-lobe printing indication value indicative of a possibility of side-lobe printing in the substrate pattern.

3. The method of claim 2, wherein updating the at least one of the arrival values based on the comparison between the design pattern corresponding to the pixelated mask pattern and the substrate pattern simulated based on the binary mask pattern further comprises:
   based on a determination that the evaluation value is greater than or equal to a predetermined threshold, updating the at least one of the arrival values; and
   based on a determination that the evaluation value is smaller than the predetermined threshold, outputting the binary mask pattern for mask making.

4. The method of claim 1, wherein determining the arrival values for the pixels of the portion of the pixelated mask pattern further comprises:
   determining a ridge point as the brightest pixel of the portion or the darkest pixel of the portion;
   determining speed values associated with the pixels of the portion based on image characteristics of the pixels of the portion and distances between the ridge point and the pixels of the portion; and
   determining the arrival values based on the speed values and the distances.

5. The method of claim 4, wherein the image characteristics comprise at least one selected from: brightness values of the pixels, intensities of the pixels, colors of the pixels, and/or image gradients associated with the pixels, wherein the image gradients are indicative of changes associated with the pixels in at least one selected from: of the brightness values of the pixels, the intensities of the pixels, and the colors of the pixels.

6. The method of claim 1, wherein determining the binary mask pattern based on the arrival values further comprises determining a segment of the binary mask pattern as pixels of the portion having the same predetermined value of the arrival values.

7. The method of claim 1, wherein the binary mask pattern comprises a curve-linear pattern.

8. The method of claim 1, wherein the binary mask pattern comprises at least one selected from: a main pattern and/or a sub-resolution assistant feature (SRAF).

9. The method of claim 1, further comprising determining, using inverse lithography technology (ILT), the pixelated mask pattern based on the design pattern.

10. An apparatus for determining a binary mask pattern from a pixelated mask pattern, the apparatus comprising:
 a processor; and
 a memory coupled to the processor, the memory storing instructions which when executed by the processor become operational with the processor to at least:
  determine, based on a fast marching method (FMM), arrival values for pixels of a portion of the pixelated mask pattern;
  determine the binary mask pattern based on the arrival values determined based on the FMM; and
  update at least one of the arrival values based on a comparison between a design pattern corresponding to the pixelated mask pattern and a substrate pattern simulated based on the binary mask pattern.

11. The apparatus of claim 10, wherein the comparison between the design pattern and the substrate pattern further comprises determination of an evaluation value based on at least one selected from: an edge placement error (EPE) between the design pattern and the substrate pattern, a nominal process window condition, a mask error enhancement factor (MEEF), and/or a side-lobe printing indication value indicative of a possibility of side-lobe printing in the substrate pattern.

12. The apparatus of claim 11, wherein the memory comprising the instructions operational with the processor to update the at least one of the arrival values further comprises instructions which when executed by the processor become operational with the processor to:
 based on a determination that the evaluation value is greater than or equal to a predetermined threshold, update the at least one of the arrival values; and
 based on a determination that the evaluation value is smaller than the predetermined threshold, output the binary mask pattern for mask making.

13. The apparatus of claim 10, wherein the memory comprising the instructions operational with the processor to determine the arrival values for the pixels of the portion of the pixelated mask pattern further comprises instructions which when executed by the processor become operational with the processor to:
 determine a ridge point as the brightest pixel of the portion or the darkest pixel of the portion;
 determine speed values associated with the pixels of the portion based on image characteristics of the pixels of the portion and distances between the ridge point and the pixels of the portion; and
 determine the arrival values based on the speed values and the distances.

14. The apparatus of claim 13, wherein the image characteristics comprise at least one selected from: brightness values of the pixels, intensities of the pixels, colors of the pixels, and/or image gradients associated with the pixels, wherein the image gradients are indicative of changes associated with the pixels in at least one selected from: the brightness values of the pixels, the intensities of the pixels, and/or the colors of the pixels.

15. The apparatus of claim 10, wherein the memory comprising the instructions operational with the processor to determine the binary mask pattern based on the arrival values further comprises instructions which when executed by the processor become operational with the processor to determine a segment of the binary mask pattern as pixels of the portion having the same predetermined value of the arrival values.

16. The apparatus of claim 10, wherein the binary mask pattern comprises at least one selected from: a main pattern and/or a sub-resolution assistant feature (SRAF), and wherein the at least one selected from: the main pattern and/or the SRAF comprises a curve-linear pattern.

17. A non-transitory computer-readable storage medium, comprising instructions for determining a binary mask pattern from a pixelated mask pattern, which instructions when executed by a processor become operational with the processor to at least:
 determine, based on a fast marching method (FMM), arrival values for pixels of a portion of the pixelated mask pattern;
 determine the binary mask pattern based on the arrival values determined based on the FMM; and
 update at least one of the arrival values based on a comparison between a design pattern corresponding to the pixelated mask pattern and a substrate pattern simulated based on the binary mask pattern.

18. The non-transitory computer-readable storage medium of claim 17, wherein the instructions operational with the processor to update the at least one of the arrival values further comprise instructions which when executed by the processor become operational with the processor to:
 based on a determination that an evaluation value is greater than or equal to a predetermined threshold, update the at least one of the arrival values, wherein the evaluation value is determined based on at least one selected from: an edge placement error (EPE) between the design pattern and the substrate pattern, a nominal process window condition, a mask error enhancement factor (MEEF), and/or a side-lobe printing indication value indicative of a possibility of side-lobe printing in the substrate pattern; and
 based on a determination that the evaluation value is smaller than the predetermined threshold, output the binary mask pattern for mask making.

19. The non-transitory computer-readable storage medium of claim 17, wherein the instructions operational with the processor to determine the arrival values for the pixels of the portion of the pixelated mask pattern further comprise instructions which when executed by the processor become operational with the processor to:
 determine a ridge point as the brightest pixel of the portion or the darkest pixel of the portion;
 determine speed values associated with the pixels of the portion based on image characteristics of the pixels of the portion and distances between the ridge point and the pixels of the portion, wherein the image characteristics comprise at least one selected from: brightness values of the pixels, intensities of the pixels, colors of the pixels, and/or image gradients associated with the pixels, wherein the image gradients are indicative of changes associated with the pixels in at least one selected from: the brightness values of the pixels, the intensities of the pixels, and/or the colors of the pixels; and determine the arrival values based on the speed values and the distances.

20. The non-transitory computer-readable storage medium of claim 17, wherein the instructions operational with the processor to determine the binary mask pattern based on the arrival values further comprise instructions which when executed by the processor become operational with the processor to determine a segment of the binary mask pattern as pixels of the portion having the same predetermined value of the arrival values.

* * * * *